United States Patent
Kohlscheen

(10) Patent No.: US 12,290,862 B2
(45) Date of Patent: May 6, 2025

(54) COATING, METHOD FOR COATING, AND COATED CUTTING TOOL

(71) Applicant: KENNAMETAL INC., Latrobe, PA (US)

(72) Inventor: Joern Kohlscheen, Ebermannstadt (DE)

(73) Assignee: KENNAMETAL INC., Latrobe, PA (US)

( * ) Notice: Subject to any disclaimer, the term of this patent is extended or adjusted under 35 U.S.C. 154(b) by 97 days.

(21) Appl. No.: 18/136,081

(22) Filed: Apr. 18, 2023

(65) Prior Publication Data

US 2023/0271260 A1    Aug. 31, 2023

Related U.S. Application Data

(62) Division of application No. 17/234,578, filed on Apr. 19, 2021, now Pat. No. 11,731,202.

(51) Int. Cl.
  *C23C 14/06* (2006.01)
  *B23B 27/14* (2006.01)
  (Continued)

(52) U.S. Cl.
  CPC ............ *B23B 27/148* (2013.01); *B23B 27/14* (2013.01); *B23C 5/16* (2013.01); *C23C 14/0641* (2013.01);
  (Continued)

(58) Field of Classification Search
  None
  See application file for complete search history.

(56) References Cited

U.S. PATENT DOCUMENTS 7,226,670 B2    6/2007    Derflinger et al.
7,348,074 B2    3/2008    Derflinger
(Continued)

FOREIGN PATENT DOCUMENTS

CN    105543780 A    5/2016
DE    102009018813 A1    10/2010
(Continued)

OTHER PUBLICATIONS

Jan. 9, 2023 Non-Final Office Action U.S. Appl. No. 17/234,578, 6 pages.
(Continued)

*Primary Examiner* — Shamim Ahmed
*Assistant Examiner* — Bradford M Gates
(74) *Attorney, Agent, or Firm* — Christopher J. Owens

(57) ABSTRACT

A method for coating a substrate 11 is disclosed. The method includes at least the following steps: depositing a first base layer 22 comprising a nitride of at least Al and Cr on the substrate 11 by physical vapor deposition at a gradually increasing substrate bias voltage from a first substrate bias voltage to a second substrate bias voltage; depositing a second base layer 23 comprising a nitride of at least Al and Cr on the first base layer 22 by physical vapor deposition at a constant substrate bias voltage that is greater or equal to the second substrate bias voltage; and depositing an outermost indicator layer 24 on the second base layer 23, wherein the outermost indicator layer 24 comprises a nitride of Si and Me, wherein Me is at least one of Ti, Zr, Hf, and Cr, wherein the outermost indicator layer 24 is deposited by physical vapor deposition at a substrate bias voltage that is less than the constant substrate bias voltage applied during deposition of the second base layer 23.

14 Claims, 3 Drawing Sheets

(51) Int. Cl.
  *B23C 5/16* (2006.01)
  *C23C 28/00* (2006.01)
  *C23C 30/00* (2006.01)

(52) U.S. Cl.
  CPC ............ *C23C 28/42* (2013.01); *C23C 30/005* (2013.01); *B23B 2224/08* (2013.01); *B23B 2224/36* (2013.01)

(56) References Cited

U.S. PATENT DOCUMENTS

| | | | |
|---|---|---|---|
| 7,851,075 | B2 | 12/2010 | Derflinger et al. |
| 7,988,832 | B2 | 8/2011 | Derflinger et al. |
| 8,227,098 | B2 | 7/2012 | Åstrand |
| 2006/0051618 | A1 | 3/2006 | Festeau et al. |
| 2008/0090099 | A1 | 4/2008 | Ramm et al. |
| 2008/0226943 | A1 | 9/2008 | Fang et al. |
| 2008/0286608 | A1 | 11/2008 | Quinto et al. |
| 2009/0155559 | A1* | 6/2009 | Xu ................. C23C 28/042 428/457 |
| 2010/0215951 | A1 | 8/2010 | Shibata et al. |
| 2010/0263503 | A1 | 10/2010 | Fontaine et al. |
| 2012/0003466 | A1 | 1/2012 | Tamura et al. |
| 2013/0216804 | A1 | 8/2013 | Schier |
| 2014/0124098 | A1 | 5/2014 | Duttlinger et al. |
| 2015/0232978 | A1 | 8/2015 | Schier |
| 2018/0044773 | A1 | 2/2018 | Eriksson et al. |
| 2018/0223436 | A1 | 8/2018 | Schier |
| 2019/0193165 | A1* | 6/2019 | Takahashi ............ C23C 28/42 |
| 2020/0002819 | A1* | 1/2020 | Stiens ............... C23C 30/005 |
| 2020/0255931 | A1 | 8/2020 | Schier et al. |
| 2021/0213538 | A1 | 7/2021 | Schier et al. |
| 2022/0372629 | A1 | 11/2022 | Vetter et al. |

FOREIGN PATENT DOCUMENTS

| | | |
|---|---|---|
| DE | 102011108088 A1 | 1/2013 |
| KR | 20210081519 A | 7/2021 |
| WO | 2008043606 A1 | 4/2008 |

OTHER PUBLICATIONS

Apr. 4, 2023 Notice of Allowance for U.S. Appl. No. 17/234,578, 9 pages.
Oerlikon Balzers: "Balinit Alnova, The Success Formula for End Mills," pp. 1-4.
Sabitzer C., et al., "Influence of Bias Potential and Layer Arrangement on Structure and Mechanical Properties of Arc Evaporated Al—Cr—N Coatings," Vacuum, Elsevier, 2014, vol. 106, pp. 49-52.
Mar. 1, 2024 Foreign Office Action Chinese Application No. CN202210398114.0, 2 pages.

* cited by examiner

COATING, METHOD FOR COATING, AND COATED CUTTING TOOL

This application is a division of U.S. patent application Ser. No. 17/234,578, which was filed on Apr. 19, 2021.

FIELD

The present application relates to the field of coatings, in particular coatings for cutting tools.

BACKGROUND

Cutting tools used for machining of difficult-to-cut materials, such as titanium and nickel alloys, typically consist of a main body and a coating applied to the main body. The coating is used to make the cutting tool harder and/or more wear-resistant, to protect the main body, and to improve the cutting properties. A typical coating may include one or more layers made of hard materials such as aluminum titanium nitride. Physical vapor deposition (PVD) methods are typically used when depositing aluminum titanium nitride, in which the PVD coatings are deposited with relatively high compressive stresses to improve performance. With relatively high compressive stresses, there is a risk of early delamination of the coating at or near the cutting edge especially for small hone sizes (sharp edges).

An object of the present invention is to provide improved coatings for cutting tools with superior performance and increased service life for cutting difficult-to-cut materials, such as titanium and nickel alloys.

SUMMARY

In one embodiment, a coating includes: a first base layer including a nitride of at least Al and Cr, wherein the first base layer has residual compressive stresses that vary over a thickness direction to define a positive residual compressive stress gradient from a first residual compressive stress at a first distance from the substrate to a second residual compressive stress at a second distance from the substrate, wherein the second distance is greater than the first distance, and wherein the second residual compressive stress is greater than the first residual compressive stress; a second base layer comprising a nitride of at least Al and Cr overlying the first base layer, wherein the second base layer has residual compressive stresses that are substantially constant over a thickness direction, wherein the substantially constant residual compressive stresses are greater than or equal to the second residual compressive stress of the first base layer; and an outermost indicator layer overlying the second base layer, wherein the outermost indicator layer comprises a nitride of Si and Me, wherein Me is at least one of Ti, Zr, Hf, and Cr, wherein the outermost indicator layer has residual compressive stresses that are less than the residual compressive stresses of the second base layer.

In another embodiment, a method for coating a substrate includes: depositing a first base layer comprising a nitride of at least Al and Cr on the substrate by physical vapor deposition at a gradually increasing substrate bias voltage from a first substrate bias voltage to a second substrate bias voltage; depositing a second base layer comprising a nitride of at least Al and Cr on the first base layer by physical vapor deposition at a constant substrate bias voltage that is greater than or equal to the second substrate bias voltage; and depositing an outermost indicator layer on the second base layer, wherein the outermost indicator layer comprises a nitride of Si and Me, wherein Me is at least one of Ti, Zr, Hf, and Cr, wherein the outermost indicator layer is deposited by physical vapor deposition at a substrate bias voltage that is less than the constant substrate bias voltage applied during deposition of the second base layer.

In yet another embodiment, a coated cutting tool includes: a substrate having a rake face, a flank face, and a cutting edge formed at the intersection of the rake face and the flank face; and a coating overlying the substrate. The coating includes: a first base layer comprising a nitride of at least Al and Cr, wherein the first base layer has residual compressive stresses that vary over a thickness direction to define a positive residual compressive stress gradient from a first residual compressive stress at a first distance from the substrate to a second residual compressive stress at a second distance from the substrate, wherein the second distance is greater than the first distance, and wherein the second residual compressive stress is greater than the first residual compressive stress; a second base layer comprising a nitride of at least Al and Cr overlying the first base layer, wherein the second base layer has residual compressive stresses that are substantially constant over a thickness direction, wherein the substantially constant residual compressive stresses are greater than or equal to the second residual compressive stress of the first base layer; and an outermost indicator layer overlying the second base layer, wherein the outermost indicator layer comprises a nitride of Si and Me, wherein Me is at least one of Ti, Zr, Hf, and Cr, wherein the outermost indicator layer has residual compressive stresses that are less than the residual compressive stresses of the second base layer.

Other embodiments of the disclosed coated body and method for coating will become apparent from the following detailed description, the accompanying drawings and the appended claims.

DETAILED DESCRIPTION

Embodiments described herein can be understood more readily by reference to the following detailed description and examples and their previous and following descriptions. However, the present description is not limited to the specific embodiments presented in the detailed description and examples. It should be recognized that these embodiments are merely illustrative of the principles of the present description.

Figure 1:
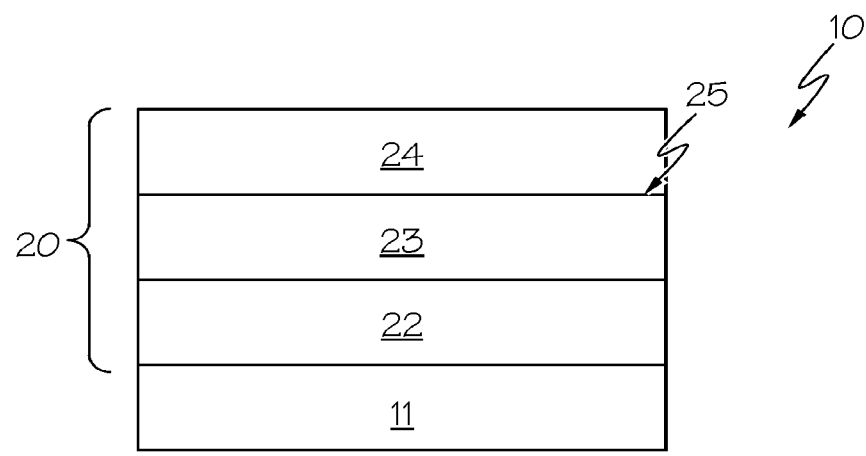
FIG. 1 is a representative view of a cross-section of a coating of a coated body according to an embodiment described herein.
Figure 2:
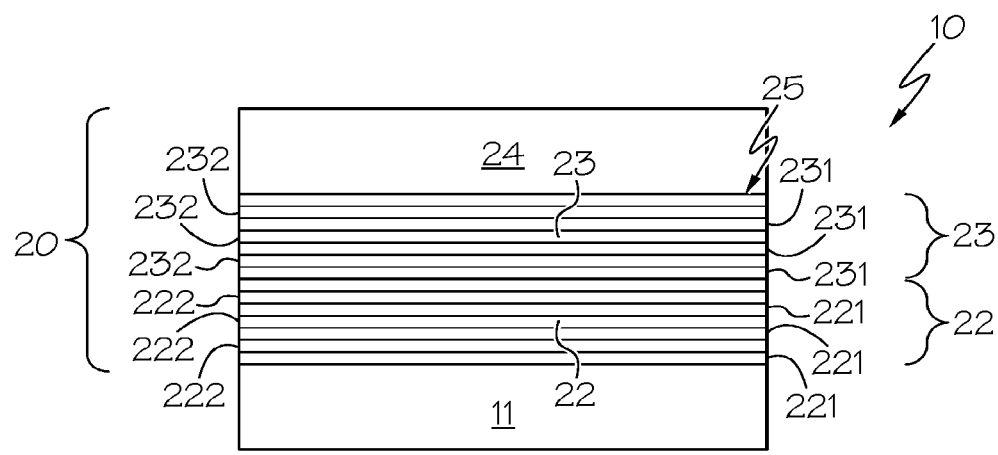
FIG. 2 is a representative view of a cross-section of a coating of a coated body according to another embodiment described herein.

FIG. 1 is a representative view of a cross-section of a coating 20 of a coated body 10 according to an embodiment described herein. FIG. 2 is a representative view of a cross-section of a coating 20 of a coated body 10 according to another embodiment described herein. Referring to FIGS. 1 and 2, the coating 20 of the coated body 10 includes a first base layer 22 overlying a substrate 11, a second base layer 23 overlying the first base layer 22, and an outermost indicator layer 24 overlying the second base layer 23.

The coated body 10 may have any shape not inconsistent with the objectives of the present description. In an aspect, the coated body may have the shape of a cutting tool. Cutting tools include, but are not limited to, indexable cutting inserts, end mills, saw blades, or drill bits. Indexable cutting inserts can have any desired ANSI standard geometry for milling or turning applications. The substrate of a coated cutting tool typically includes one or more cutting edges formed at the juncture of a rake face and at least one flank face of the substrate. In an aspect, the one or more cutting edges may have an edge radius of up to 10 microns. In a specific example, the cutting tool is an end mill.

The substrate 11 of the coated body may include any substrate not inconsistent with the objectives of the present description. Exemplary substrates for the coated body include substrates formed of cemented carbide, carbide, polycrystalline diamond, polycrystalline cubic boron nitride, ceramic, cermet, steel or other alloy.

In a specific example, the substrate is formed of cemented carbide. A cemented carbide substrate may include tungsten carbide (WC). WC can be present in any amount not inconsistent with the objectives of the present description. For example, WC can be present in an amount of at least 70 weight percent, in an amount of at least 80 weight percent, or in an amount of at least 85 weight percent. Additionally, a metallic binder of cemented carbide can include cobalt or cobalt alloy. Cobalt, for example, can be present in a cemented carbide substrate in an amount ranging from 1 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide substrates can also include one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can include one or more solid solution carbides in an amount ranging from 0.1-5 weight percent. Additionally, a cemented carbide substrate can include nitrogen.

The first base layer 22 includes a nitride of at least Al and Cr, particularly AlCrN, more particularly $Al_xCr_{1-x}N$, wherein $0.20 \leq x \leq 0.85$. The AlCrN ternary system has at least two main advantages over AlTiN. It allows for applying higher substrate voltages before compressive stress gets unacceptably high and it shows an extended range of cubic phase stability compared to AlTiN. In an aspect, the first base layer 22 includes at least 90 vol. % face-centered cubic crystalline phase. In an example, the first base layer 22 includes 90 to 92 vol. % face-centered cubic crystalline phase. In another example, the first base layer 22 includes 92 to 94 vol. % face-centered cubic crystalline phase. In yet another example, the first base layer 22 includes 94 to 96 vol. % face-centered cubic crystalline phase. In yet another example, the first base layer 22 includes 96 to 98 vol. % face-centered cubic crystalline phase. In yet another example, the first base layer 22 includes 98 to 100 vol. % face-centered cubic crystalline phase. In a preferred aspect, the texture of the first base layer is AlCrN cubic 111 preferred with equal or higher intensity than the related 200 signal in an XRD Bragg Brentano scan. By way of including a high amount of face-centered cubic crystalline phase and low amount of hexagonal phase, a high hardness can be provided to the first base layer 22.

In another aspect, the first base layer 22 includes at most 10 vol. % hexagonal crystalline phase. In an example, the first base layer 22 includes 0 to 2 vol. % hexagonal crystalline phase. In another example, the first base layer 22 includes 2 to 4 vol. % hexagonal crystalline phase. In yet another example, the first base layer 22 includes 4 to 6 vol. % hexagonal crystalline phase. In yet another example, the first base layer 22 includes 6 to 8 vol. % hexagonal crystalline phase. In yet another example, the first base layer 22 includes 8 to 10 vol. % hexagonal crystalline phase. By including a small amount of hexagonal phase, the toughness of the first base layer may be increased.

The cubic phase of AlCrN is stable when the Al content is as high as about 70 atomic percent beyond which soft hexagonal AlN phase tends to form. In an aspect, the first base layer 22 includes $Al_xCr_{1-x}N$, wherein $0.20 \leq x \leq 0.70$. In an example, the first base layer 22 includes $Al_xCr_{1-x}N$, wherein $0.20 \leq x \leq 0.30$. In another example, the first base layer 22 includes $Al_xCr_{1-x}N$, wherein $0.30 \leq x \leq 0.40$. In yet another example, the first base layer 22 includes $Al_xCr_{1-x}N$, wherein $0.40 \leq x \leq 0.50$. In yet another example, the first base layer 22 includes $Al_xCr_{1-x}N$, wherein $0.50 \leq x \leq 0.60$. In yet another example, the first base layer 22 includes $Al_xCr_{1-x}N$, wherein $0.60 \leq x \leq 0.70$.

When the Al content is higher than about 70 atomic percent, soft hexagonal AlN phase tends to form. Small amounts of hexagonal phase can be intentionally added to relieve stress and increase toughness of the first base layer. In an aspect, the first base layer 22 includes $Al_xCr_{1-x}N$, wherein $0.70 \leq x \leq 085$. In an example, the first base layer 22 includes $Al_xCr_{1-x}N$, wherein $0.70 \leq x \leq 0.75$. In another example, the first base layer 22 includes $Al_xCr_{1-x}N$, wherein $0.75 \leq x \leq 0.80$. In yet another example, the first base layer 22 includes $Al_xCr_{1-x}N$, wherein $0.80 \leq x \leq 0.85$.

Referring to FIG. 2, the first base layer 22 may include alternating sublayers 221, 222 of varying compositions. In particular, the alternating sublayers 221, 222 may include a first sublayer 221 having a first ratio of Al:Cr and a second sublayer 221 having a second ratio of Al:Cr, wherein the first ratio is different from the second ratio. By way of providing alternating sublayers of varying compositions, the cubic phase of AlCrN can be stabilized to allow for Al content much higher than 70 atomic percent while maximizing cubic phase and minimizing the hexagonal phase. The alternating sublayers of varying composition may be provided, for example, by depositing alternating sublayers using a first source material having a first ratio of Al:Cr (e.g. 70:30 Al:Cr ratio) and a second source material having a second ratio of Al:Cr (e.g. 90:10 Al:Cr ratio), wherein the first ratio is different from the second ratio. More particularly, the substrate may be positioned on a turntable, and the turntable may rotate with respect to the first source material and the second source material, thereby leading to the formation of a nano-laminate in which the lower ratio of Al:Cr of the first source material serves as a template to stabilize the cubic phase during deposition of the higher ratio of Al:Cr of the second source material.

The second base layer 23 includes a nitride of at least Al and Cr, particularly AlCrN, more particularly $Al_xCr_{1-x}N$, wherein $0.20 \leq x \leq 0.85$. The AlCrN ternary system has at least two main advantages over AlTiN. It allows for applying higher substrate voltages before compressive stress gets unacceptably high and it shows an extended range of cubic phase stability compared to AlTiN. In an aspect, the second base layer 23 includes at least 90 vol. % face-centered cubic crystalline phase. In an example, the second base layer 23 includes 90 to 92 vol. % face-centered cubic crystalline phase. In another example, the second base layer 23 includes 92 to 94 vol. % face-centered cubic crystalline phase. In yet another example, the second base layer 23 includes 94 to 96 vol. % face-centered cubic crystalline phase. In yet another example, the second base layer 23 includes 96 to 98 vol. % face-centered cubic crystalline phase. In yet another example, the second base layer 23 includes 98 to 100 vol. % face-centered cubic crystalline phase. In a preferred aspect, the texture of the first base layer is AlCrN cubic 111 preferred with equal or higher intensity than the related 200 signal in an XRD Bragg Brentano scan. By way of including a high amount of face-centered cubic crystalline phase and low amount of hexagonal phase, a high hardness can be provided to the first base layer 22.

In another aspect, the second base layer 23 includes at most 10 vol. % hexagonal crystalline phase. In an example, the second base layer 23 includes 0 to 2 vol. % hexagonal crystalline phase. In another example, the second base layer 23 includes 2 to 4 vol. % hexagonal crystalline phase. In yet another example, the second base layer 23 includes 4 to 6 vol. % hexagonal crystalline phase. In yet another example, the second base layer 23 includes 6 to 8 vol. % hexagonal crystalline phase. In yet another example, the second base layer 23 includes 8 to 10 vol. % hexagonal crystalline phase. By including a small amount of hexagonal phase, the toughness of the second base layer may be increased.

The cubic phase of AlCrN is stable when the Al content is as high as about 70 atomic percent beyond which soft hexagonal AlN phase tends to form. In an aspect, the second base layer 23 includes $Al_xCr_{1-x}N$, wherein $0.20 \leq x \leq 0.70$. In an example, the second base layer 23 includes $Al_xCr_{1-x}N$, wherein $0.20 \leq x \leq 0.30$. In another example, the second base layer 23 includes $Al_xCr_{1-x}N$, wherein $0.30 \leq x \leq 0.40$. In yet another example, the second base layer 23 includes $Al_xCr_{1-x}N$, wherein $0.40 \leq x \leq 0.50$. In yet another example, the second base layer 23 includes $Al_xCr_{1-x}N$, wherein $0.50 \leq x \leq 0.60$. In yet another example, the second base layer 23 includes $Al_xCr_{1-x}N$, wherein $0.60 \leq x \leq 0.70$.

When the Al content is higher than about 70 atomic percent, soft hexagonal AlN phase tends to form. Small amounts of hexagonal phase can be intentionally added to relieve stress and increase toughness of the second base layer. In an aspect, the second base layer 23 includes $Al_xCr_{1-x}N$, wherein $0.70 \leq x \leq 085$. In an example, the second base layer 23 includes $Al_xCr_{1-x}N$, wherein $0.70 \leq x \leq 0.75$. In another example, the second base layer 23 includes $Al_xCr_{1-x}N$, wherein $0.75 \leq x \leq 0.80$. In yet another example, the second base layer 23 includes $Al_xCr_{1-x}N$, wherein $0.80 \leq x \leq 0.85$.

Referring to FIG. 2, the second base layer 23 may include alternating sublayers 231, 232 of varying compositions. In particular, the alternating sublayers 231, 232 may include a first sublayer 231 having a first ratio of Al:Cr and a second sublayer 232 having a second ratio of Al:Cr, wherein the first ratio is different from the second ratio. By way of providing alternating sublayers of varying compositions, the cubic phase of AlCrN can be stabilized to allow for Al content much higher than 70 atomic percent while maximizing cubic phase and minimizing the hexagonal phase. The alternating sublayers of varying composition may be provided by, for example, depositing alternating sublayers using a first source material having a first ratio of Al:Cr (e.g. 70:30 Al:Cr ratio) and a second source material having a second ratio of Al:Cr (e.g. 90:10 Al:Cr ratio), wherein the first ratio is different from the second ratio. More particularly, the substrate may be positioned on a turntable, and the turntable may rotate with respect to the first source material and the second source material, thereby leading to the formation of a nano-laminate in which the lower ratio of Al:Cr of the first source material serves as a template to stabilize the cubic phase during deposition of the higher ratio of Al:Cr of the second source material.

Figure 3:
FIG. 3 is line graph representing residual compressive stress vs. distance from the substrate according to an aspect of the present description.

As shown in FIG. 3, the first base layer 22 has residual compressive stresses that vary over a thickness direction to define a positive residual compressive stress gradient from a first residual compressive stress at a first distance from the substrate to a second residual compressive stress at a second distance from the substrate, wherein the second distance is greater than the first distance, and wherein the second residual compressive stress is greater than the first residual compressive stress. The positive residual compressive stress gradient may be provided by, for example, gradually increasing substrate bias voltage during deposition of the first base layer 22.

As further shown in FIG. 3, the second base layer 23 has residual compressive stresses that are substantially constant over a thickness direction, wherein the substantially constant residual compressive stresses are greater than or equal to the second residual compressive stress of the first base layer 22. The substantially constant residual compressive stresses may be provided by, for example, applying a constant high substrate bias voltage during deposition of the second base layer 23.

By providing the positive residual compressive stress gradient to first base layer 22 and the substantially constant high residual compressive stresses to the second base layer 23, the resulting coating can have improved performance while minimizing risk of early delamination of the coating at or near the cutting edge.

Figure 4:
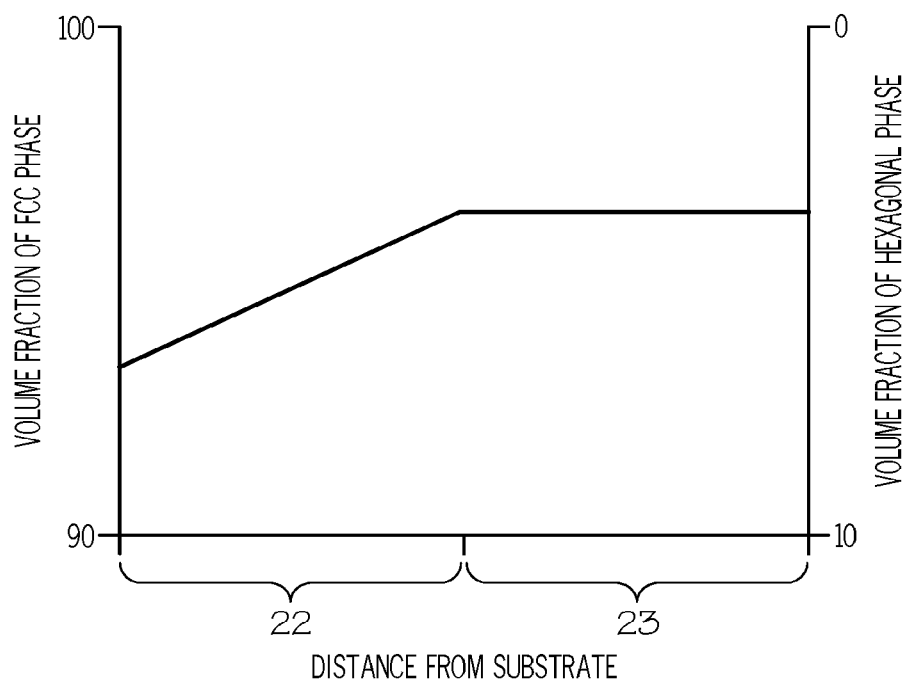
FIG. 4 is line graph representing volume fraction of face-centered cubic phase and volume fraction of hexagonal phase vs. distance from the substrate according to an aspect of the present description.

As shown in FIG. 4, the first base layer 22 may have a volume fraction of face-centered cubic crystalline phase that varies over the thickness direction to define a gradient from a first volume fraction of face-centered cubic crystalline phase at the first distance from the substrate to a second volume fraction of face-centered cubic crystalline phase at the second distance from the substrate, wherein the second volume fraction of face-centered cubic crystalline phase is greater than the first volume fraction of face-centered cubic crystalline phase. The gradient of face-centered cubic crystalline phase may be provided by, for example, gradually increasing substrate bias voltage during deposition of the first base layer 22 while controlling a ratio of Al:Cr to be high enough to form a hexagonal phase with a face-centered cubic crystalline phase.

As further shown in FIG. 4, the second base layer 23 may have a volume fraction of face-centered cubic crystalline phase that is substantially constant over a thickness direction, wherein the substantially constant volume fraction of face-centered cubic crystalline phase is greater than or equal to the second volume fraction of face-centered cubic crystalline phase of the first base layer. The substantially constant volume fraction of face-centered cubic crystalline phase may be provided by, for example, applying a constant high substrate bias voltage during deposition of the second base layer 23 and/or by controlling a ratio of Al:Cr to be low enough to form a predominantly face-centered cubic crystalline phase.

As shown in FIG. 4, the first base layer 22 may have a volume fraction of hexagonal crystalline phase that varies over the thickness direction to define a gradient from a first volume fraction of hexagonal crystalline phase at the first distance from the substrate to a second volume fraction of hexagonal crystalline phase at the second distance from the substrate, wherein the second volume fraction of hexagonal crystalline phase is less than the first volume fraction of hexagonal crystalline phase. The gradient of hexagonal crystalline phase may be provided by, for example, gradually increasing substrate bias voltage during deposition of the first base layer 22 while controlling a ratio of Al:Cr to be high enough to form a hexagonal phase with a face-centered cubic crystalline phase.

As further shown in FIG. 4, the second base layer 23 may have a volume fraction of hexagonal crystalline phase that is substantially constant over a thickness direction, wherein the substantially constant volume fraction of hexagonal crystalline phase is less than or equal to the second volume fraction of hexagonal crystalline phase of the first base layer. The substantially constant volume fraction of hexagonal crystalline phase may be provided by, for example, applying a constant high substrate bias voltage during deposition of the second base layer 23 and/or by controlling a ratio of Al:Cr to be low enough to avoid forming a hexagonal phase.

In an aspect, the first and second base layers may have a combined thickness in a range of from 1.0 μm to 5.0 μm, preferably in a range of from 1.5 μm to 4.0 μm, more preferably in a range of from 1.8 μm to 3.5 μm. If the combined thickness of the first and second base layers is too high or too low, then the life of the coating may be reduced.

Returning to FIGS. 1 and 2, the outermost indicator layer 24, which overlies the second base layer 23, is provided for easy wear detection, in which the outermost indicator layer 24 is formed from a different color (e.g. non-gray color) than the first and second base layers. The outermost indicator layer 24 includes a nitride of Si and Me, wherein Me is at least one of Ti, Zr, Hf, and Cr. Thereby, the outermost indicator layer 23 makes it possible to discern with the naked eye the wear on of a cutting edge of a cutting tool which has been provided with this outermost layer.

In an aspect, the outermost indicator layer 23 includes $Me_{1-y}Si_yN$, wherein $0.05 \leq y \leq 0.20$, wherein Me is at least one of Ti, Zr, Hf, and Cr. Adding Si in a range of 5 to 20 atomic percent leads to further increase in wear resistance for the resulting coating while maintaining good wear indication. TiSiN and similar ternary systems provide chemical stability and anti-sticking properties that are desired for difficult-to-cut materials.

As shown in FIG. 3, the outermost indicator layer 23 has residual compressive stresses that are less than the residual compressive stresses of the second base layer 22. The lower residual compressive stresses of the outermost indicator layer 23 may be provided by, for example, applying a medium substrate bias voltage during deposition of the outermost indicator layer 23.

In an aspect, the outermost indicator layer 23 may have a thickness in a range of from 0.1 μm to 1.5 μm, preferably in a range of from 0.3 μm to 1.2 μm, more preferably in a range of from 0.5 μm to 1.0 μm. If the thickness of the outermost indicator layer 23 is too high, then early delamination may occur. If the thickness of the outermost indicator layer 23 is too low, then the intended effect of the outermost indicator layer 23 may be insufficient.

In an aspect, the coating 20 may further include a transition layer 25 between the second base layer 23 and the outermost indicator layer 24. The transition layer 25 provides for a gradual transition from the composition of the second base layer 23 to the composition of the outermost indicator layer 24. By providing the transition layer 25, there may be improved cohesion between the second base layer 23 and the outermost indicator layer 24. In an aspect, the transition layer 25 may include a nitride of Al, Cr, Si, and Me, wherein Me is at least one of Ti, Zr, Hf, and Cr.

In an aspect, the coating 20 may have a total thickness in a range of from 1.1 μm to 6.5 μm, preferably in a range of from 1.8 μm to 5.2 μm, more preferably in a range of from 2.3 μm to 4.5 μm. If the total thickness of the coating 20 is too high or too low, then the life of the coating may be reduced.

According to the present description, a method for coating a substrate includes depositing a first base layer comprising a nitride of at least Al and Cr on the substrate by physical vapor deposition at a gradually increasing substrate bias voltage from a first substrate bias voltage to a second substrate bias voltage, depositing a second base layer comprising a nitride of at least Al and Cr on the first base layer by physical vapor deposition at a constant substrate bias voltage that is greater or equal to the second substrate bias voltage, and depositing an outermost indicator layer on the second base layer, wherein the outermost indicator layer comprises a nitride of Si and Me, wherein Me is at least one of Ti, Zr, Hf, and Cr, wherein the outermost indicator layer is deposited by physical vapor deposition at a substrate bias voltage that is less than the constant substrate bias voltage applied during deposition of the second base layer.

The coating applied by physical vapor deposition may be applied by any PVD process. Typical PVD processes include evaporation processes, activated reactive evaporation, arc discharge evaporation, laser ablation, ion plating, sputtering, ion plating, and ion beam assisted deposition.

A PVD coating method typically may comprise all or some of the following units and steps: a cleaning station for cleaning and drying process steps; a pre-coating surface treating of the substrates, such as, but not limited to electropolishing, shot peening, microblasting, wet blasting, grinding, brushing, jet abrading and compressed air blasting, dust extraction and vacuum cleaning; a quality management computer system for effective in-process quality control and documentation; a batching station for handling the sequence and method for automatic loading parts; and an optional post-coating surface treating, such as, but not limited to, blasting, shot peening, compressed air blasting, and brushing, to further improve the surface finish of the coated parts.

According to the present description, a method for cutting a material includes cutting the material using a coated cutting tool of the present description. In an aspect, the coated cutting tool may be used to cut difficult-to-cut materials, such as titanium and nickel.

Experimental Examples

Variant coatings #1, #2, and #3, in accordance with the present description, were applied to end mill cutting tools according to the conditions of Table 1 below.

TABLE 1

Coating details

| PVD equipment | Oerlikon Balzers Innova | | |
|---|---|---|---|
| | var #1 | var #2 | var #3 |
| pressure/mbar | | 0.04 | |
| evaporator current/A | | 150 | |
| temperature/C. | | 480 | |
| 1st base layer Al content x in $Al_xCr_{1-x}N$/at. % | ~0.68 | ~0.68 | ~0.68 |
| 1st base layer time for ramping substrate bias from 50 to 150 V/min | 50 | 50 | 30 |
| 1st base layer thickness/µm | 1.6 | 1.6 | 0.9 |
| 1st base layer residual stress/GPa | −3.5 | −3.5 | −3.5 |
| 1st base layer hexagonal phase/wt. % | ~9 | ~9 | ~9 |
| 2nd base layer Al content x in $Al_xCr_{1-x}N$/at. % | ~0.68 | ~0.68 | ~0.68 |
| 2nd base layer time for constant substrate bias at 150 V/min | 50 | 50 | 30 |
| 2nd base layer thickness/µm | 1.6 | 1.6 | 0.9 |
| 2nd base layer residual stress/GPa | −4.7 | −4.7 | −4.7 |
| 2nd base layer hexagonal phase/wt. % | ~5 | ~5 | 5 |
| top layer Si content y in $Ti_{1-y}Si_yN$/at. % | ~0.13 | ~0.13 | ~0.13 |
| top layer time for substrate bias at 120 V/min | 30 | 60 | 60 |
| top layer thickness/µm | 0.3 | 0.6 | 0.6 |
| top layer residual stress/GPa | −4.5 | −4.5 | −4.5 |

The resulting end mill cutting tools, in accordance with the present description, were tested under the following metal cutting test conditions of Table 2 below.

TABLE 2

Metal cutting test conditions

| CNC unit | Haas VF3SS | |
|---|---|---|
| tool | SC end mill | 12 mm, 5 flute |
| workpiece | Ti—6Al—4V | |
| coolant | flood | |
| speed | 110 m/min | 361 sfm |
| radial eng. | 1 mm | 0.039 in. |
| DOC | 12 mm | 0.472 in. |
| feed | 0.1 mm/edge | 0.0039 ipt |
| max. wear | 0.12 mm | end of test |

Figure 5:
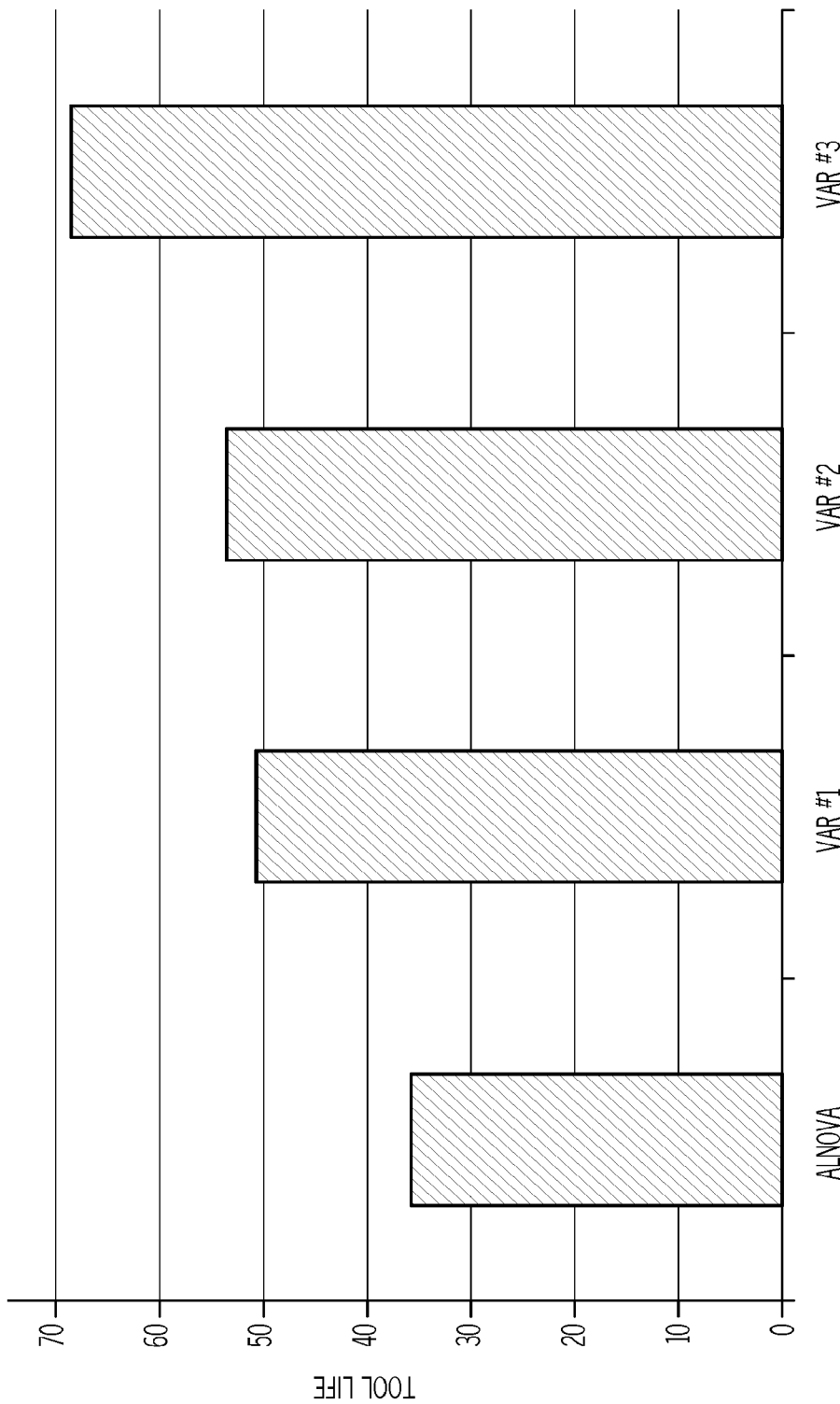
FIG. 5 is bar graph showing tool-life results for variant coatings #1, #2, and #3, in accordance with the present description, in comparison to an end mill cutting tool having a conventional Alnova coating.

Table 3 below show the tool-life results for variant coatings #1, #2, and #3, in accordance with the present description, in comparison to an end mill cutting tool having a conventional Alnova coating. As shown the tool-life of all three variant coatings #1, #2, and #3 resulting improved tool-life compared to the conventional Alnova coating. FIG. 5 shows the tool-life results in bar graph form.

TABLE 3

| | Alnova | var #1 | var #2 | var #3 |
|---|---|---|---|---|
| tool-life | 35.7 | 51 | 53.6 | 68.9 |

Although various embodiments of the disclosed coated body and method for coating have been shown and described, modifications may occur to those skilled in the art upon reading the specification. The present application includes such modifications and is limited only by the scope of the claims.

The invention claimed is:

1. A method for coating a substrate, the method comprising:
    depositing a first base layer comprising a nitride of at least Al and Cr on the substrate by physical vapor deposition at an increasing substrate bias voltage from a first substrate bias voltage to a second substrate bias voltage to provide increasing compressive stress in the first base layer;
    depositing a second base layer comprising a nitride of at least Al and Cr on the first base layer by physical vapor deposition at a constant substrate bias voltage that is greater or equal to the second substrate bias voltage to provide a constant compressive stress; and
    depositing an outermost indicator layer on the second base layer, wherein the outermost indicator layer comprises a nitride of Si and Me, wherein Me is at least one of Ti, Zr, Hf, and Cr, wherein the outermost indicator layer is deposited by physical vapor deposition at a substrate bias voltage that is less than the constant substrate bias voltage applied during deposition of the second base layer.

2. The method of claim 1, wherein depositing the first base layer comprises depositing alternating sublayers using a first source material having a first ratio of Al: Cr and a second source material having a second ratio of Al:Cr, wherein the first ratio of Al:Cr is different than the second ratio of Al:Cr.

3. The method of claim 2, wherein the first ratio of Al:Cr is lower than the second ratio of Al:Cr.

4. The method of claim 3, wherein the first ratio of Al:Cr is 70:30 and the second ratio of Al:Cr is 90:10.

5. The method of claim 1, wherein depositing the second base layer comprises depositing alternative sublayers, wherein the alternating sublayers include a first sublayer having a first ratio of Al:Cr and a second sublayer having a second ratio of Al:Cr, wherein the first ratio is different from the second ratio.

6. The method of claim 5, wherein the first ratio of Al:Cr is lower than the second ratio of Al:Cr.

7. The method of claim 6, wherein the first ratio of Al:Cr is 70:30 and the second ratio is 90:10.

8. The method of claim 1, wherein the first base layer comprises at least 90 vol. % face-centered cubic crystalline phase.

9. The method of claim 1, wherein the second base layer comprises at least 90 vol. % face-centered cubic crystalline phase.

10. The method of claim 1, wherein the first base layer has a volume fraction of face-centered cubic crystalline phase that varies over a thickness direction to define a gradient from a first volume fraction of face-centered cubic crystalline phase at a first distance from the substrate to a second volume fraction of face-centered cubic crystalline phase at a second distance from the substrate, wherein the second volume fraction of face-centered cubic crystalline phase is greater than the first volume fraction of face-centered cubic crystalline phase.

11. The method of claim 10, wherein the second base layer has a volume fraction of face-centered cubic crystalline phase that is substantially constant over a thickness direction, wherein the substantially constant volume fraction of face-centered cubic crystalline phase is greater than or equal to the second volume fraction of face-centered cubic crystalline phase of the first base layer.

12. The method of claim 1, wherein the substrate has a rake face, a flank face, and a cutting edge formed at the intersection of the rake face and the flank face.

13. The method of claim 1 wherein the first base layer of AlCrN is face-centered cubic crystalline phase 111 with equal or higher intensity than a related 200 signal in an XRD Bragg Brentano scan.

14. A method for coating a substrate, the method comprising:
  depositing a first base layer consisting essentially of a nitride of Al and Cr on the substrate by physical vapor deposition at an increasing substrate bias voltage from a first substrate bias voltage to a second substrate bias voltage to provide increasing compressive stress in the first base layer;
  depositing a second base layer consisting essentially of a nitride of Al and Cr on the first base layer by physical vapor deposition at a constant substrate bias voltage that is greater or equal to the second substrate bias voltage to provide a constant compressive stress; and
  depositing an outermost indicator layer on the second base layer, wherein the outermost indicator layer comprises a nitride of Si and Me, wherein Me is at least one of Ti, Zr, Hf, and Cr, wherein the outermost indicator layer is deposited by physical vapor deposition at a substrate bias voltage that is less than the constant substrate bias voltage applied during deposition of the second base layer.

* * * * *